United States Patent [19]
Itahara et al.

[11] Patent Number: 5,706,202
[45] Date of Patent: Jan. 6, 1998

[54] FREQUENCY SPECTRUM ANALYZING APPARATUS AND TRANSMITTER CHARACTERISTICS MEASURING APPARATUS USING THE SAME

[75] Inventors: Hiroshi Itahara; Takashi Seike, both of Atsugi, Japan

[73] Assignee: Anritsu Corporation, Tokyo, Japan

[21] Appl. No.: 611,241

[22] Filed: Mar. 5, 1996

[30] Foreign Application Priority Data

Mar. 8, 1995 [JP] Japan ................................. 7-077434

[51] Int. Cl.$^6$ ................................................ G01R 23/16
[52] U.S. Cl. ..................... 364/485; 364/484; 364/576; 364/726; 324/76.19; 324/76.21; 324/76.43; 324/76.45
[58] Field of Search ...................... 364/484–487, 364/178, 572, 575, 576, 724.01, 724.13, 726; 324/76.15, 76.13, 76.19, 76.21–76.24, 76.26, 76.27, 76.28, 76.38, 76.41, 76.42, 76.43, 76.44, 76.45, 76.47, 76.58, 76.59; 370/208, 210; 375/224

[56] References Cited

U.S. PATENT DOCUMENTS

| | | | |
|---|---|---|---|
| 5,210,483 | 5/1993 | Amamoto et al. | 324/76.27 |
| 5,293,114 | 3/1994 | McCormich et al. | 324/76.22 |
| 5,475,709 | 12/1995 | Futagami et al. | 375/224 |
| 5,563,909 | 10/1996 | Nakazawa | 375/224 |

OTHER PUBLICATIONS

H. Yanagawa et al; Anritsu Technical Bulletin No. 66, Sep., 1993; pp. 74–84. (Only some portions translated).

K. Nakatsugawa et al; Anritsu Technical Bulletin No. 51, Mar. 1986; pp.52–57. (Only some portions translated).

R. Crochiere et al; "Multirate Digital Signal Processing"; 1983 by Prentice–Hall, Inc., pp. 303–325.

Japan, Zaidanhoujin Musen–setsubi–kensa–kentei–kyokai (also called MKK), i.e. foundation of Radio–Equipment–Inspection–Authorization–Association in Japan, Technical Standard Matching Approval "Characteristics Test Method (Part 2) of Radio Equipment"; pp. 51–52, Jul. 1993. (no translation).

*Primary Examiner*—Emanuel T. Voeltz
*Assistant Examiner*—Hal D. Wachsman
*Attorney, Agent, or Firm*—Frishauf, Holtz, Goodman, Langer & Chick, P.C.

[57] ABSTRACT

In a frequency spectrum analyzing apparatus which utilizes a DFT (discrete Fourier transform) filter bank, and can detect the peak value of the amplitude of an input signal, a time sequence signal generation circuit samples an input signal to convert it into a time sequence signal. A memory stores the time sequence signal. The DFT filter bank receives a time sequence signal read out from the memory by a control device, and performs DFT filter bank processing corresponding to a plurality of desired frequencies while shifting a window function by a predetermined number of sample point units. An absolute value calculation unit calculates absolute values in units of outputs from the DFT filter bank. A peak value detection unit detects peak values in units of outputs from the absolute value calculation unit. A display device displays the frequency spectrum on the basis of these peak values.

8 Claims, 9 Drawing Sheets

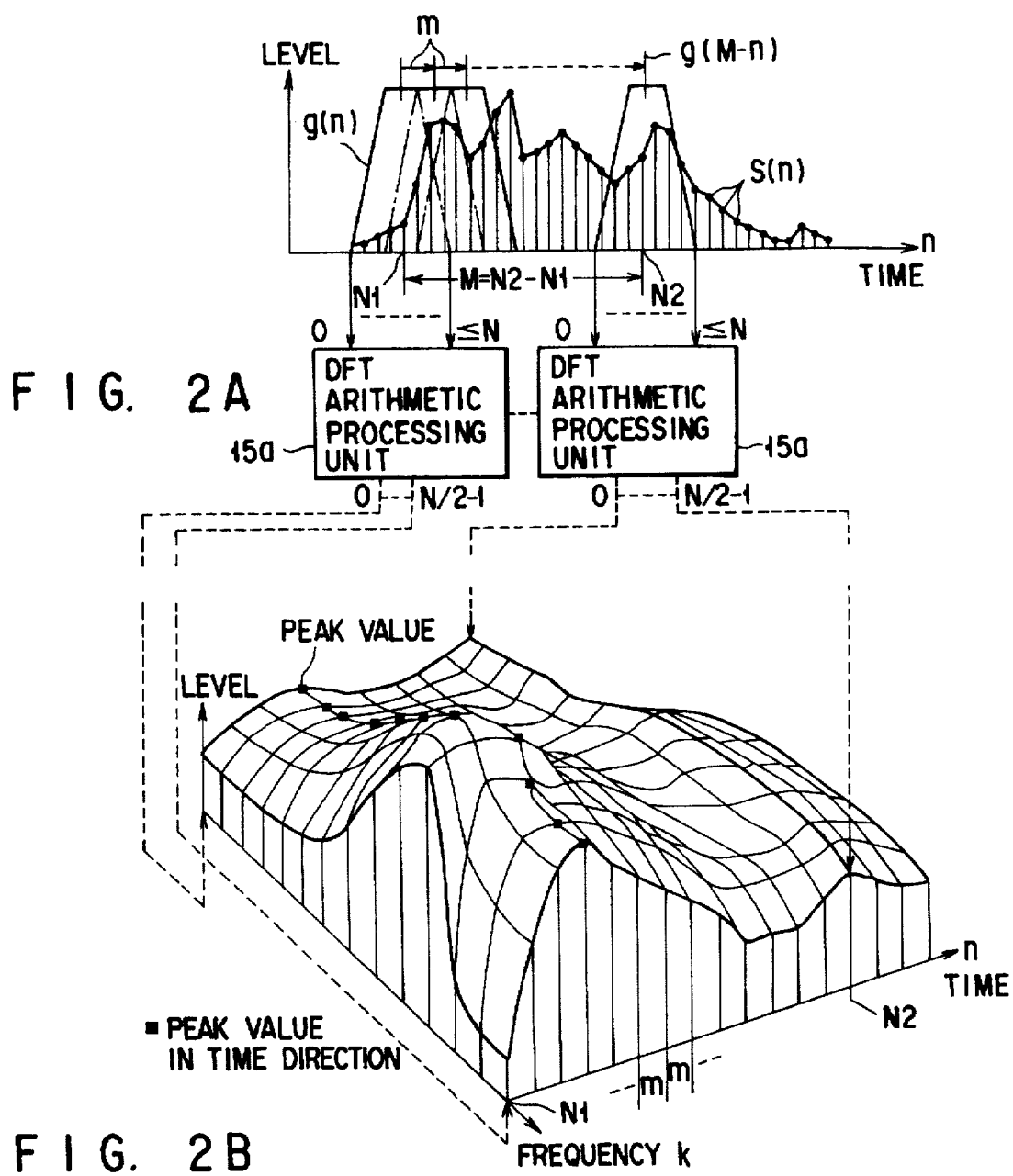
F I G. 2A
F I G. 2B
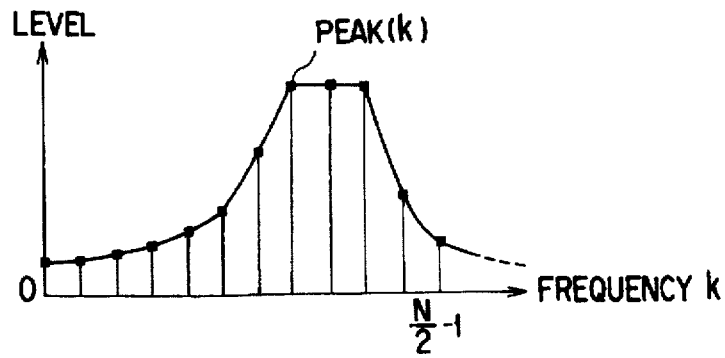
F I G. 2C

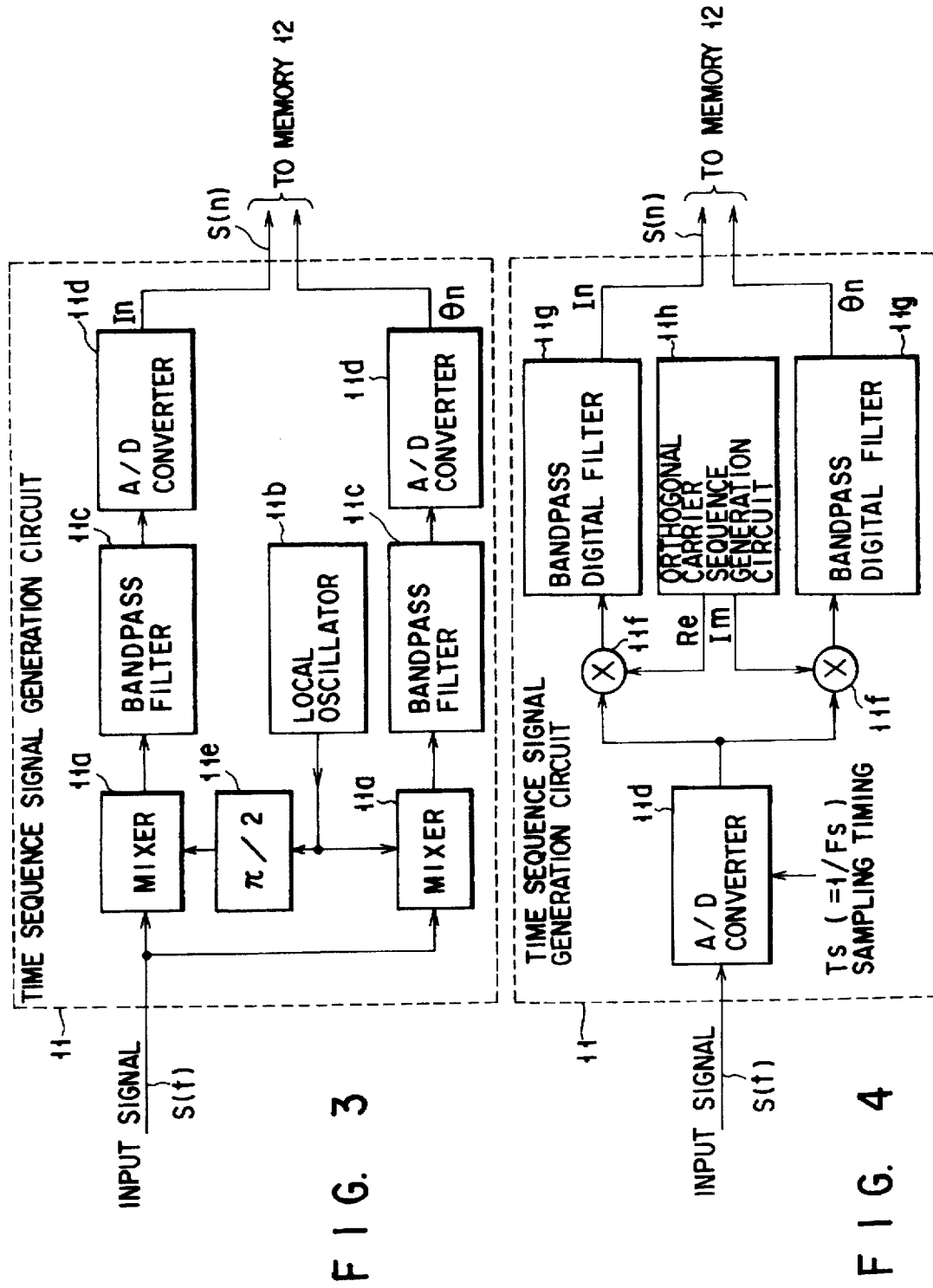

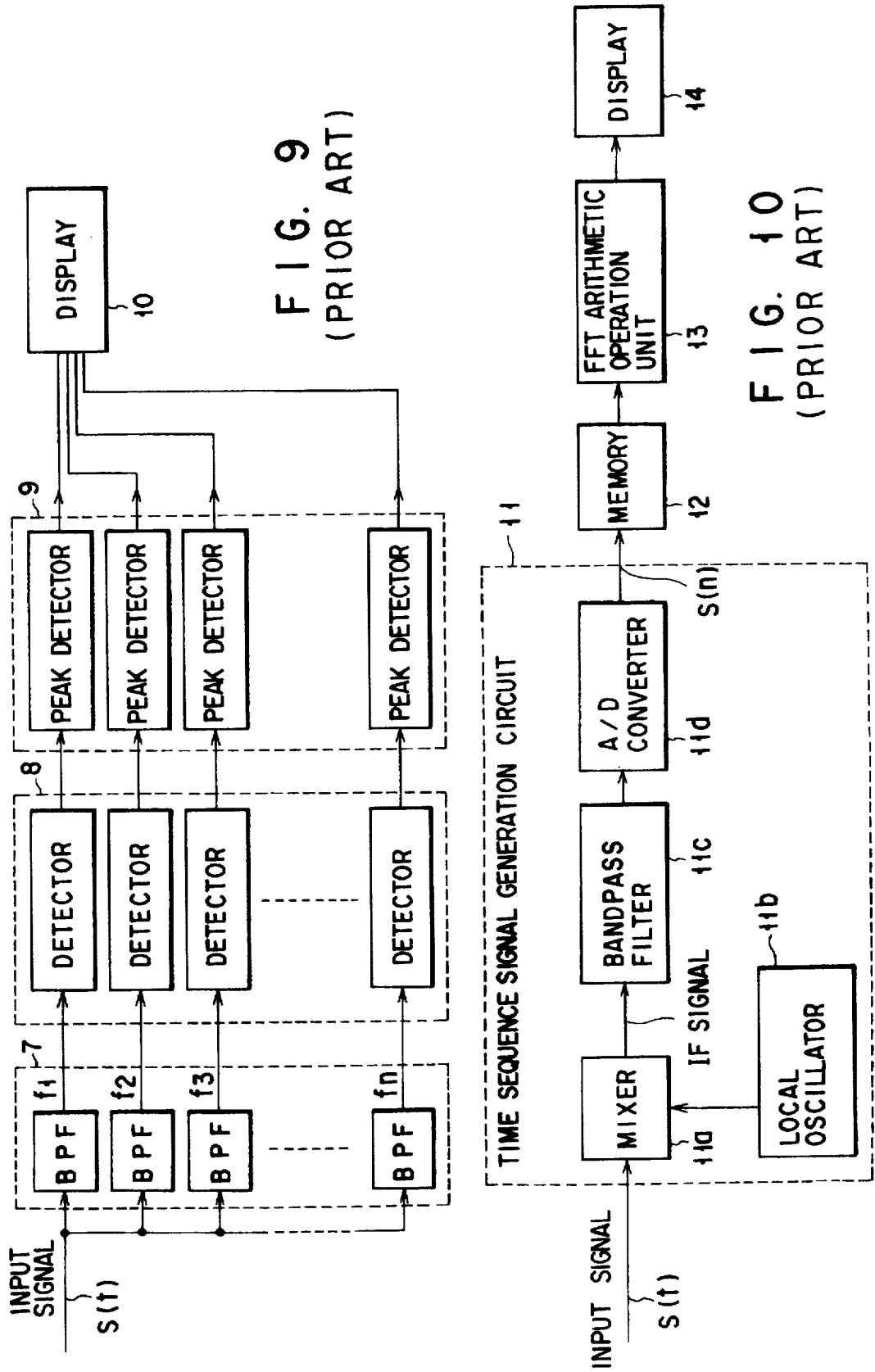

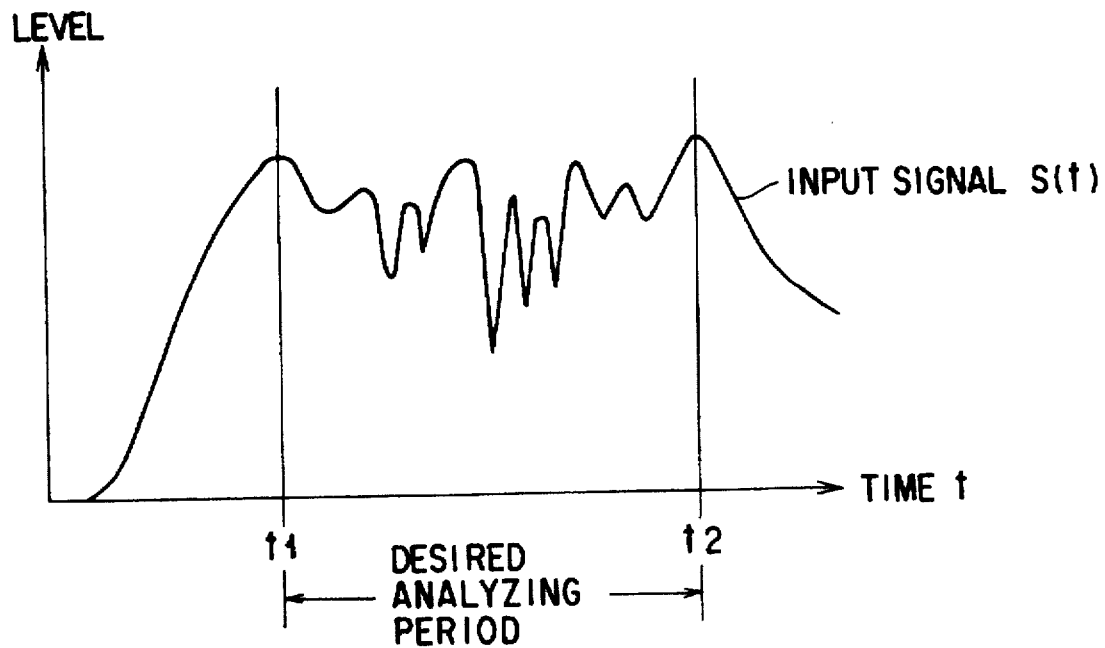
F I G. 11
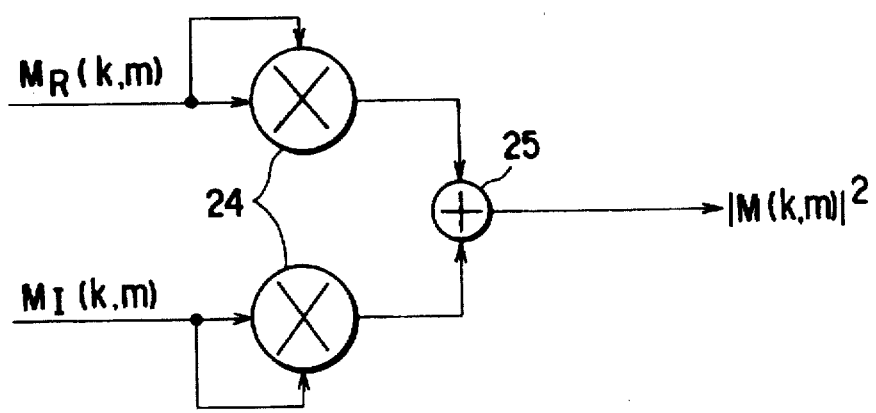
F I G. 14

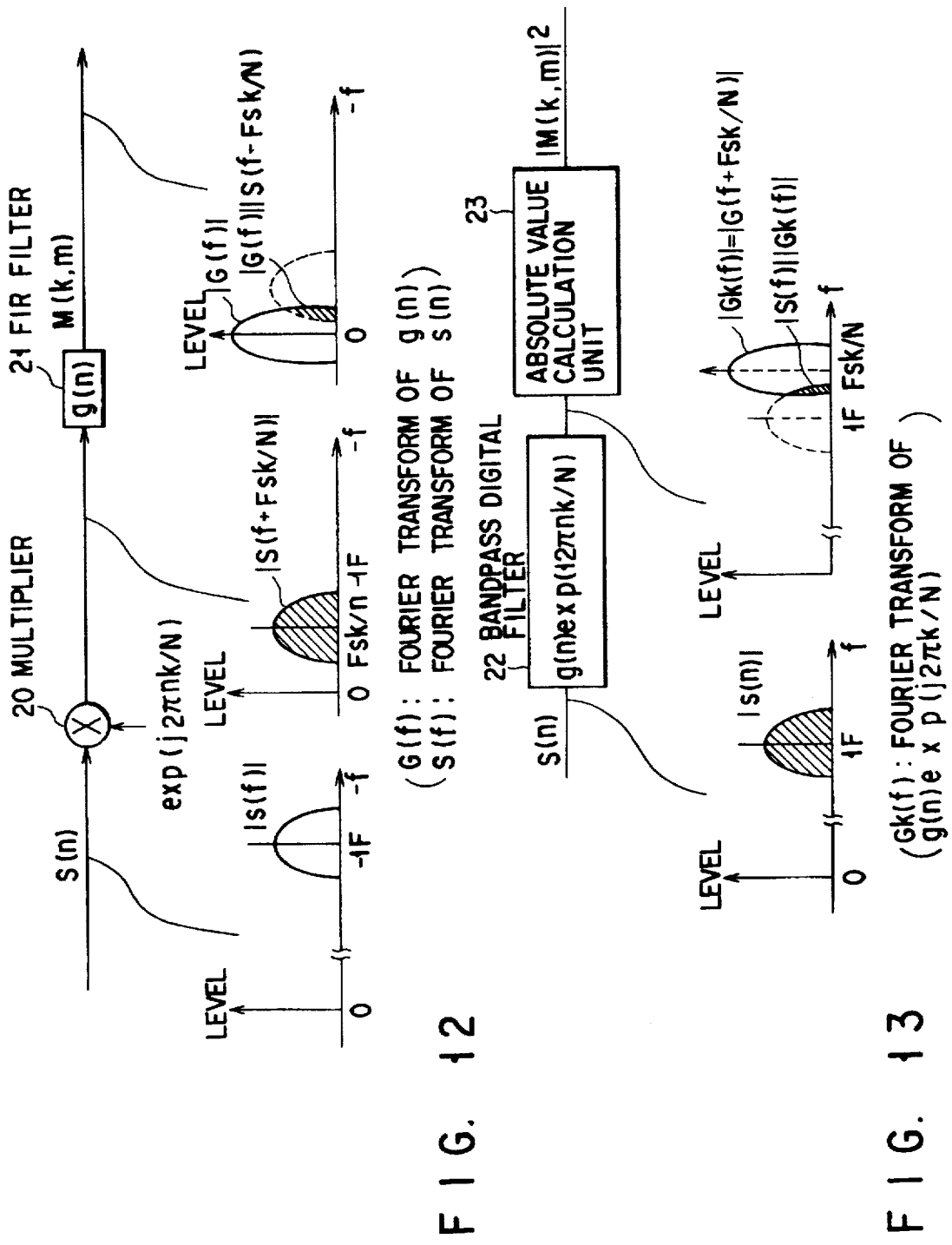

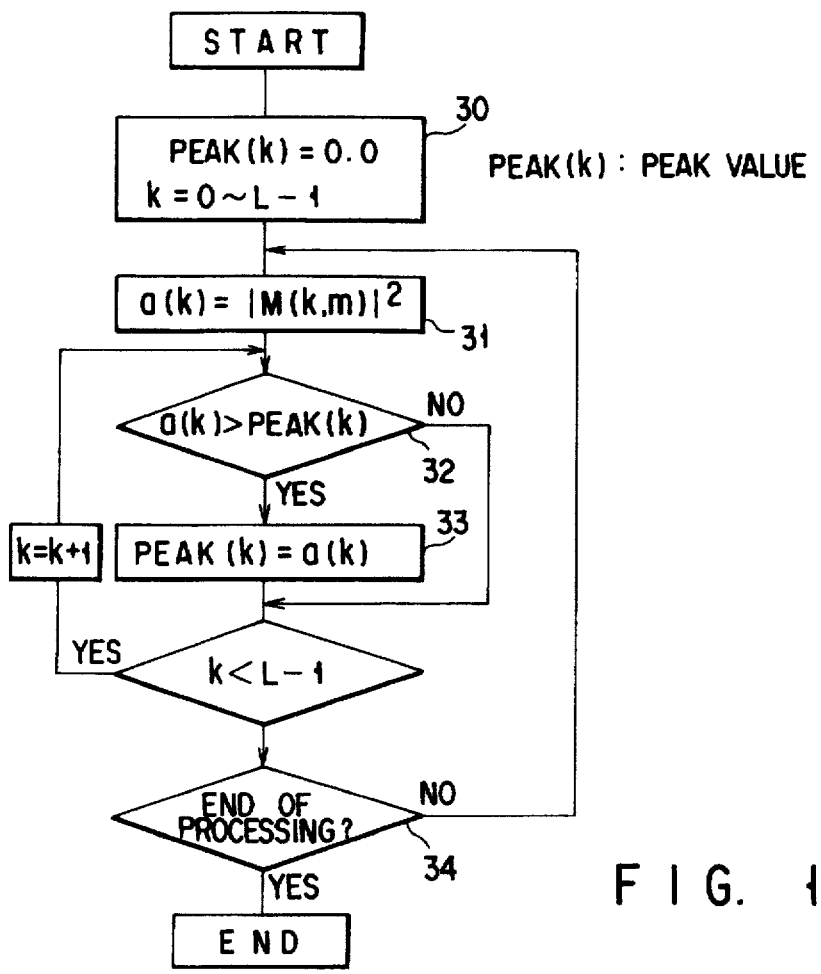
F I G. 15
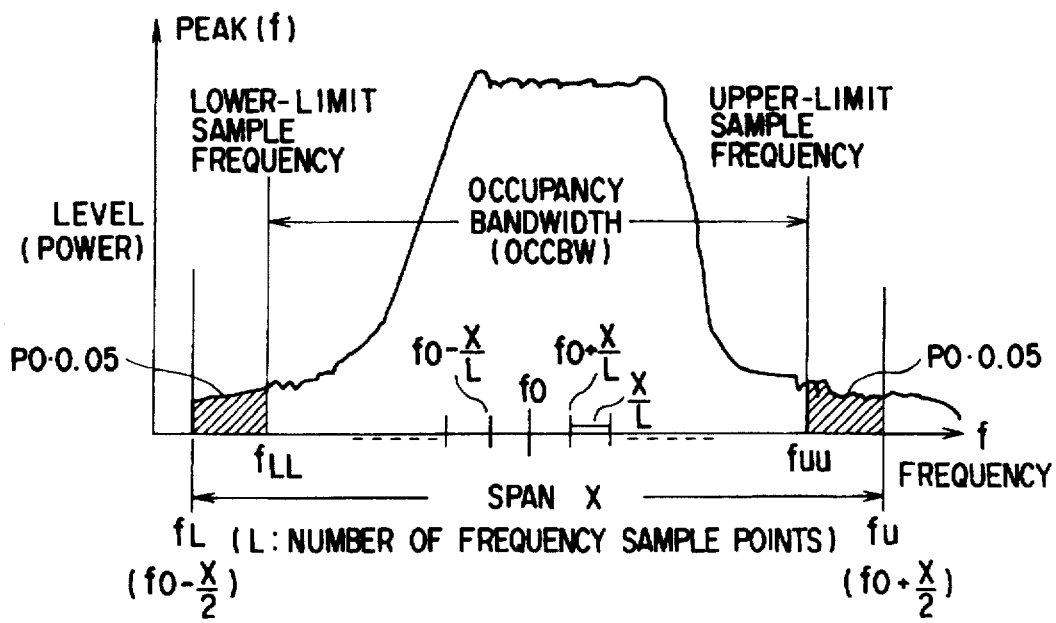
F I G. 16

5,706,202

FREQUENCY SPECTRUM ANALYZING APPARATUS AND TRANSMITTER CHARACTERISTICS MEASURING APPARATUS USING THE SAME

BACKGROUND OF THE INVENTION

1. Field of the Invention

The present invention generally relates to a frequency spectrum analyzing apparatus and a transmitter characteristics measuring apparatus using the same.

The present invention also relates to a frequency spectrum analyzing apparatus represented by a spectrum analyzer and, more particularly, to a frequency spectrum analyzing apparatus which utilizes a DFT (Discrete Fourier Transform) filter bank, and can detect the peak value of the amplitude or magnitude (wave power) of an input signal, i.e. an output signal from the DFT filter bank.

Furthermore, the present invention relates to a transmitter characteristics measuring apparatus which executes transmitter characteristics measurements of, e.g., adjacent channel leakage power, occupied bandwidth, and the like in digital mobile communication systems such as PDC (Personal Digital Cellular Communication System), PHS (Personal Handyphone System), and the like, which are currently put into practical use in Japan, using the above-mentioned spectrum analyzing apparatus.

2. Description of the Related Art

As is well known, in recent years, digital communication systems based on TDM (time division multiplexing), TDMA (time division multiplex access), FDMA (frequency division multiplex access), and the like, which perform communications while a base station and a mobile station use different frequencies, like in a mobile communication system, has been put into practical use.

In a mobile communication system which is increasingly becoming popular, PDC (Personal Digital Cellular Communication System), PHS (Personal Handyphone System), NADC (North American Digital Cellular System), GSM (Global Speciale Mobile; European digital cellular radio system), DMCA (Japan Digital MCA System), and the like are known as digital communication systems based on TDM, TDMA, FDMA, and the like.

In such digital communication system, different transmission (carrier) frequencies are assigned to a base station as a fixed station and a mobile station as a movable station, and these stations perform data communications using a corresponding one of a plurality of time slots which are divided in time.

In order to measure the adjacent channel power, occupied bandwidth, and the like in the above-mentioned digital communication systems such as PDC, PHS, and the like, a frequency spectrum analyzing apparatus for analyzing the amplitude of an input signal in the frequency domain is required. A spectrum analyzer is conventionally used in such measurements.

As a spectrum analyzer, as disclosed in, e.g., ANRITSU TECHNICAL BULLETIN No. 66, September, 1993, pp. 74–84, a frequency sweep type spectrum analyzer based on the heterodyne system is generally used. FIG. 5 shows the basic arrangement of such spectrum analyzer. Referring to FIG. 5, an input signal is sync-detected by a sweep detecting circuit 1 constituted by a mixer 1a, a local oscillator 1b, a sweep controller 1c, an analyzing filter 1d, and a detector 1e. More specifically, the input signal is mixed with a local signal from the local oscillator 1b by the mixer 1a to be converted into an intermediate frequency signal. The intermediate frequency signal passes the analyzing filter 1d serving as a bandpass filter, and is detected by the detector 1e. Note that the sweep controller 1c controls the frequency of the local signal output from the local oscillator 1b.

The detected signal output from the sweep detecting circuit 1 is amplitude-compressed by a log amplifier 2, and the compressed signal is input to a peak detector 3, thus detecting its peak value. An analog/digital (A/D) converter 4 converts the peak value (analog signal) output from the peak detector into an analog signal. The peak value, converted into the digital signal, is stored in a memory 5 in correspondence with the frequency of the local oscillator 1b (in other words, the frequency of the input signal). Thereafter, the stored peak value is read out from the memory 5 by a control device (not shown) comprising, e.g., a microprocessor, and is displayed as the frequency spectrum of the input signal on a display 6. The display 6 displays the frequency spectrum of the input signal while plotting the frequency along the abscissa and the amplitude along the ordinate of the display screen.

Note that the detection of the peak value of the detected signal by the peak detector 3 is performed for the purpose of preventing a detection error of a peak value present between a sampling pulse at a given timing used for A/D conversion and that at the next timing (holding a peak value in the frequency direction), and of holding a peak value of the detected signal in the time direction.

A case will be exemplified below wherein the adjacent channel leakage power of the above-mentioned PDC as one of the digital communication systems is measured using the frequency sweep type spectrum analyzer shown in FIG. 5. The PDC adopts TDMA (Time Division Multiple Access), and performs a communication between a base station and a mobile station using a combination of time division channels (TDM channels) and frequency division channels (FDM channels), as shown in FIG. 6.

More specifically, a communication between the stations is performed by a burst signal shown in FIG. 7 using one of the FDM channels, e.g., an FDM channel with a carrier frequency $f_0$. The communication time of the burst signal is managed based on time intervals called slots, and time intervals called frames each corresponding to a set of a plurality of slots. When a communication is performed, one slot in a frame assigned based on a predetermined time management, e.g., the first slot, is assigned as a TDM channel, and the burst signal is transmitted at, e.g., the carrier frequency $f_0$. During this communication, the assigned first slot is used all the time. In the existing PSC communication system, there are three slots per frame, and the time interval of one frame is 20 msec.

In the FDM channels, as shown in FIG. 8, an identical frequency bandwidth $\Delta f$ is assigned to carrier frequencies $f_{-2}$, $f_{-1}$, $f_0$, $f_{+1}$, and $f_{+2}$, respectively.

In such PDC communication system, FDM channels with carrier frequencies $f_{-1}$ and $f_{+1}$ are called adjacent channels with respect to the traffic channel, and FDM channels with carrier frequencies $f_{-2}$ and $f_{+2}$ are called first alternate channels with respect to the traffic channel. The spread spectrum of the burst signal often adversely influences the adjacent or first alternate FDM channels of the traffic channel and poses a problem. For example, as shown in FIG. 8, the FDM channel with the carrier frequency $f_0$ as the traffic channel must not influence its adjacent FDM channels with the carrier frequencies $f_{-1}$ and $f_{+1}$ or its first alternate FDM channels with the carrier frequencies $f_{-2}$ and $f_{+2}$.

Therefore, the measurement of a quantity for evaluating how much leakage power is generated with respect to the adjacent or first alternate channels upon using the traffic channel, i.e., the adjacent and alternate channels power, is required upon maintenance of a good communication system. The adjacent and alternate channels power is represented by the ratio of powers of adjacent channels (or first alternate channels) to that of the traffic channel. Note that most of the factors that influence this quantity are derived from the performance of a transmitter of the base or mobile station.

The conventional frequency sweep type spectrum analyzer (see FIG. 5) measures the adjacent and alternate channels power as follows. A case will be described below wherein a burst signal (FIG. 7) having the spectral characteristics shown in FIG. 8 is input to the spectrum analyzer, and the spectrum of this input signal is analyzed while sweeping frequency from a desired lowest analyzing frequency $f_L$ to a desired highest analyzing frequency $f_U$ at a resolution X/L. Note that X is called a span, and is given by $X=f_U-f_L$. Also, L is the number of frequency sample points in the span X.

More specifically, a local signal from the local oscillator 1b is sequentially swept (changed) from the lowest analyzing frequency $f_L$ to the highest analyzing frequency $f_U$ at a resolution X/L, i.e., within the range of $f_0 \pm X/2$, as shown in FIG. 8. At this time, in correspondence with the change in frequency of the local signal, the peak values of the input signal as the burst signal are sequentially detected via the analyzing filter 1d, the detector 1e, the log amplifier 2, the peak detector 3, and the A/D converter 4, and are stored in the memory 5. The peak values stored in the memory 5 are read out by a control device (not shown) comprising, e.g., a microprocessor, and powers in units of FDM channels ($f_0 \pm \Delta f/2$, $f_{-1} \pm \Delta f/2$, $f_{+1} \pm \Delta f/2$, and the like) are calculated, thus obtaining the adjacent and alternate channels power.

In the conventional frequency sweep type spectrum analyzer (frequency spectrum analyzing apparatus) with the arrangement shown in FIG. 5, when measurements of the adjacent channel power and/or first alternate channel power, occupancy bandwidth, and the like are to be performed upon reception of a burst signal (see FIG. 7) used in the above-mentioned PDC, PHS, or the like, the following problems are posed.

More specifically, since this analyzer is of frequency sweep type, one slot of the burst signal is required each time one frequency is analyzed (each time the frequency of the local signal is changed). As a result, it is impossible to perform the above-mentioned measurement for only one arbitrary slot in an arbitrary frame of the burst signal. When the adjacent and alternate channels power of the spectral characteristics shown in FIG. 8 is to be measured, as described above, a plurality of frames of the burst signal, i.e., frames corresponding to the number L of frequency sample points are required, and one measurement time cannot become shorter than (number L of frequency sample points)×(one frame time period of burst signal).

For example, in Japan, Zaidanhoujin Musen-setsubi-kensa-kentei-kyokai (also called MKK), i.e., Foundation of Radio-Equipment-Inspection-Authorization-Association in Japan recommends, in Technical Standard Matching Approval "Characteristics Test Method (Part 2) of Radio Equipment", pp. 51–52, July 1993, that upon measurement of the adjacent and alternate channels leakage power of a burst signal in PDC using a spectrum analyzer, the sweep time is set to be that including at least one frame per frequency sample point, and the number of frequency sample points is set to be 400 or more. Based on this recommendation, the sweep time requires (number L of frequency sample points)×(time interval of frame of burst signal), i.e., 400×20 msec=8 sec or longer, and one measurement time cannot be set to be shorter than 8 sec.

SUMMARY OF THE INVENTION

It is, therefore, an object of the present invention to provide a new and improved frequency spectrum analyzing apparatus which can greatly shorten the measurement time.

It is another object of the present invention to provide a transmitter characteristics measuring apparatus for executing measurements of the transmitter characteristics such as the adjacent channel leakage power, occupancy bandwidth, and the like in a digital mobile communication system using the above-mentioned improved frequency spectrum analyzing apparatus.

According to a first aspect of the present invention, there is provided a frequency spectrum analyzing apparatus comprising:

time sequence signal generation means for generating a time sequence signal by sampling a signal to be measured;

storage means for storing the time sequence signal generated by the time sequence signal generation means;

discrete Fourier transform (DFT) filter bank means for receiving a signal read out from the storage means in a desired closed time period of the time sequence signal stored in the storage means, calculating a discrete Fourier transform of the readout signal so that bandpass filter processing of the signal is performed in correspondence with a plurality of desired frequencies, and parallelly outputting processing results for the plurality of frequencies;

absolute value calculation means for calculating absolute values of the processing results for each of a plurality of outputs from the DFT filter bank means; and peak value detection means for detecting peak values of the absolute values in units of outputs from the absolute value calculation means, and outputting the peak values in correspondence with the plurality of frequencies.

According to a second aspect of the present invention, there is provided a frequency spectrum analyzing apparatus comprising:

time sequence signal generation means for generating a time sequence signal by sampling a signal to be measured;

storage means for storing the time sequence signal generated by the time sequence signal generation means;

control means for reading out a time sequence signal, corresponding to a desire closed time period, of the time sequence signal stored in the storage means;

discrete Fourier transform (DFT) filter bank means for calculating a discrete Fourier transform of the time sequence signal of the desired period read out from the storage means by the control means so that bandpass filter processing of the readout signal is performed in correspondence with a plurality of desired frequencies while shifting a window function by a predetermined sample point interval, and parallelly outputting processing results for the plurality of frequencies;

absolute value calculation means for calculating absolute values of the processing results for each of a plurality of outputs from the DFT filter bank means;

peak value detection means for detecting peak values of the absolute values in units of outputs from the absolute value calculation means, and outputting the peak values in correspondence with the plurality of frequencies; and display means for displaying the peak values output from the peak value detection means in correspondence with the plurality of frequencies.

According to a third aspect of the present invention, there is provided an adjacent and alternate channels power measurement apparatus for measuring a power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, the apparatus comprising:

time sequence signal generation means for generating a time sequence signal by sampling the burst signal;

storage means for storing the time sequence signal generated by the time sequence signal generation means;

discrete Fourier transform (DFT) filter bank means for receiving a signal read out from the storage means in a desired closed time period of the time sequence signal stored in the storage means, calculating a discrete Fourier transform of the received signal so that bandpass filter processing of the readout signal is performed in correspondence with a plurality of desired frequencies while shifting a window function by a predetermined number of sample point units, and parallelly outputting processing results for the plurality of frequencies;

absolute value calculation means for calculating absolute values of the processing results for each of a plurality of outputs from the DFT filter bank means;

peak value detection means for detecting peak values of the absolute values in units of outputs from the absolute value calculation means, and outputting the peak values in correspondence with the plurality of frequencies; and arithmetic operation means for calculating the power present in the predetermined frequency range to have, as the central frequency, the frequency of at least one of the adjacent and alternate channels in accordance with the outputs from the peak value detection means.

According to a fourth aspect of the present invention, there is provided an occupancy bandwidth measurement apparatus for measuring an occupancy bandwidth based on a power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, the apparatus comprising:

time sequence signal generation means for generating a time sequence signal by sampling the burst signal;

storage means for storing the time sequence signal generated by the time sequence signal generation means;

discrete Fourier transform (DFT) filter bank means for receiving a signal read out from the storage means in a desired closed time period of the time sequence signal stored in the storage means, calculating a discrete Fourier transform of the received signal so that bandpass filter processing of the readout signal is performed in correspondence with a plurality of desired frequencies while shifting a window function by a predetermined number of sample point units, and parallelly outputting processing results for the plurality of frequencies;

absolute value calculation means for calculating absolute values of the processing results for each of a plurality of outputs from the DFT filter bank means;

peak value detection means for detecting peak values of the absolute values in units of outputs from the absolute value calculation means, and outputting the peak values in correspondence with the plurality of frequencies; and arithmetic operation means for calculating the power present in the predetermined frequency range to have, as the central frequency, the frequency of at least one of the adjacent and alternate channels in accordance with the outputs from the peak value detection means, and calculating the occupancy bandwidth on the basis of the calculated power.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A to 2C are graphs for explaining the operation of the present invention;

FIG. 3 is a block diagram showing principal part of another embodiment of the present invention;

FIG. 4 is a block diagram showing principal part of still another embodiment of the present invention;

FIG. 9 is a block diagram showing the arrangement of a conventional non-sweep type frequency spectrum analyzing apparatus;

FIG. 10 is a block diagram showing the arrangement of a conventional FFT analyzer;

FIG. 11 is a graph showing a desired analyzing period (closed time period) of an input signal;

FIG. 12 is a diagram showing a conceptual system at arbitrary k of a DFT filter bank;

FIG. 13 is a diagram showing a system having a function equivalent to that of FIG. 11;

FIG. 14 is a diagram showing a conceptual system of an absolute value calculation unit;

FIG. 15 is a flow chart showing the operation of a peak value detection unit; and FIG. 16 is a graph for explaining the method of measuring the occupancy bandwidth.

DETAILED DESCRIPTION OF THE PREFERRED EMBODIMENTS

Figure 1:
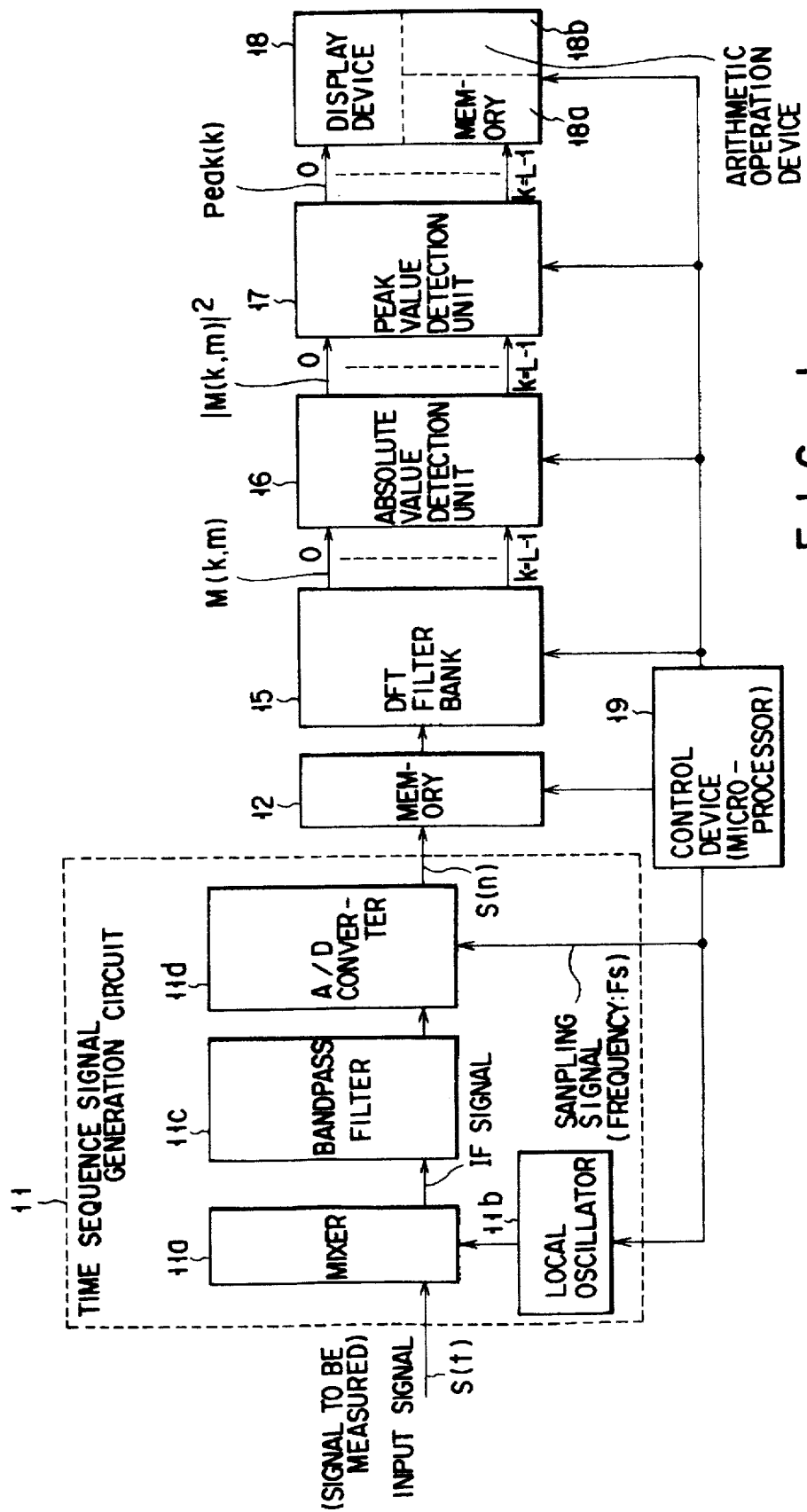
FIG. 1 is a schematic block diagram showing the arrangement of an embodiment of the present invention.

Reference will now be made in detail to the presently preferred embodiments of the invention as illustrated in the accompanying drawings, in which like reference characters designate like or corresponding parts throughout the several drawings.

An outline of the present invention will be described below.

In order to achieve the above objects, a non-sweep type (not sweep type) analog frequency spectrum analyzing apparatus, as shown in FIG. 9 was examined, and it was confirmed that the non-sweep type frequency spectrum analyzing apparatus can be efficiently realized by utilizing a DFT filter bank which adopts digital signal processing, and hence, can efficiently realize a measurement of adjacent and alternate channels power.

More specifically, the non-sweep type analog frequency spectrum analyzing apparatus shown in FIG. 9 has been conventionally considered theoretically plausible, and is implemented by a bandpass filter (BPF) group 7 (central frequencies $f_1$ to $f_n$, common bandwidth) as a group of n BPFs (i.e., analyzing filters), a detector group 8 and a peak detector group 9 arranged in correspondence with the n BPFs, and a display 10.

Figure 5:
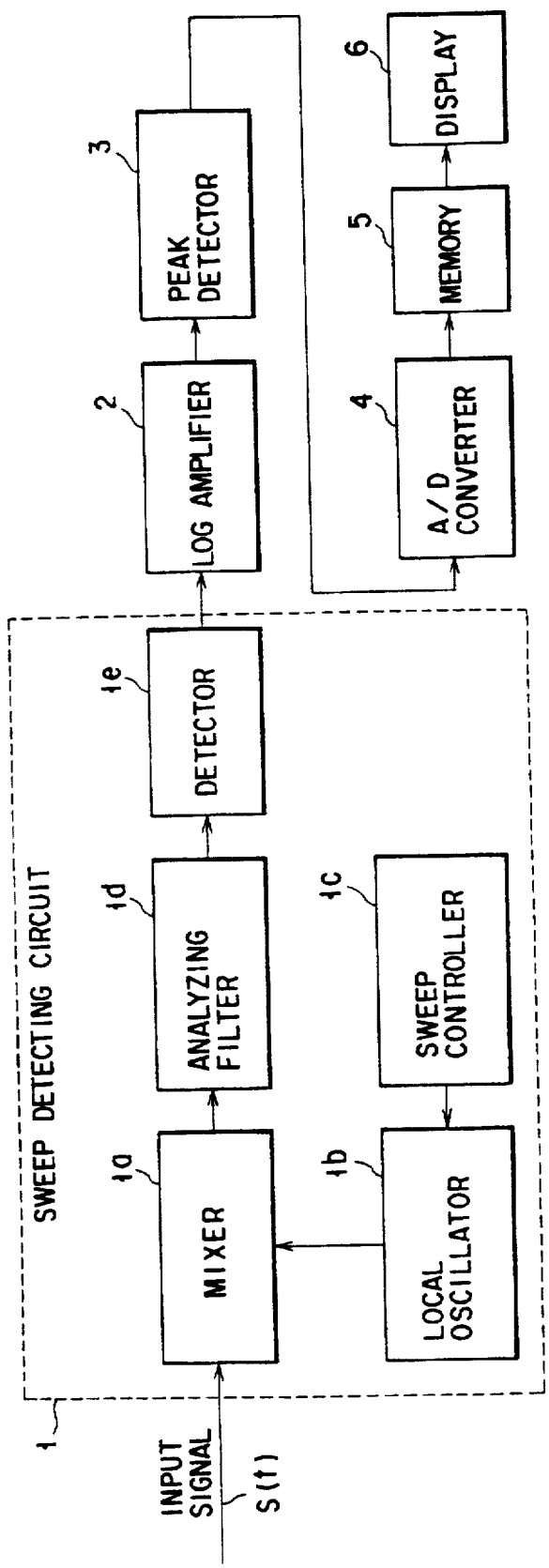
FIG. 5 is a block diagram showing the arrangement of a conventional sweep type spectrum analyzer.

The difference between the arrangements of this non-sweep type frequency spectrum analyzing apparatus and the conventional sweep type frequency spectrum analyzing apparatus shown in FIG. 5 is that the mixer 1a, the local oscillator 1b, the sweep controller 1c, and the analyzing filter 1d shown in FIG. 5 are replaced by the BPF group 7 as a group of n BPFs, i.e., the BPFs (having the same bandwidth as that of the analyzing filter 1d) are arranged in correspondence with the number of steps of the change in frequency of the local oscillator 1b, so as to perform parallel spectral analyzing operations.

Figure 8:
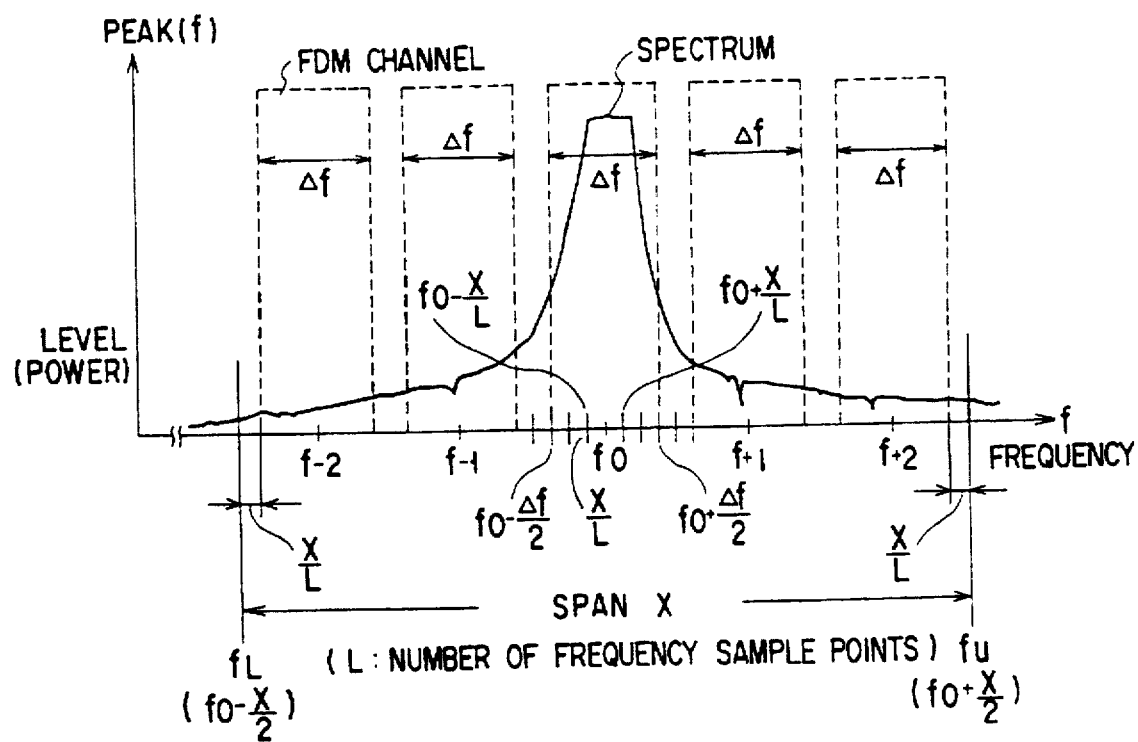
FIG. 8 is a graph for explaining FDM channels, the spectral characteristics of a burst signal, and the method of measuring adjacent and alternate channels power.

For example, when the adjacent and alternate channels power of a burst signal with the spectral characteristics shown in FIG. 8 above is to be measured, the lowest analyzing frequency $f_L$, the highest frequency $f_U$, and X/L (FIG. 8) as the sweep (analyzing) resolution respectively correspond to the central frequencies $f_1, f_2, \ldots, f_n$ of the BPF group 7 shown in FIG. 9, and the difference between the central frequencies of adjacent BPFs (i.e., $f_n-f_{n-1}$).

Since the frequency spectrum analyzing apparatus shown in FIG. 9 is of non-sweep type, problems posed in a measurement system using the conventional sweep type spectrum analyzer shown in FIG. 5 can be solved. However, since special-purpose analyzing filters, detectors, and peak detectors must be arranged in advance in correspondence with n required frequencies $f_1$ to $f_n$, such an apparatus is impractical as it has poor compatibility and a huge hardware volume. The present invention can solve the impractical problems by using a DFT filter bank which adopts digital signal processing, while taking advantage of the above-mentioned features.

More specifically, a frequency spectrum analyzing apparatus of the present invention comprises a memory for storing a time-serial signal or time sequence signal obtained by sampling a signal to be measured. Also the frequency spectrum analyzing apparatus of the present invention comprises a discrete Fourier transform (DFT) filter bank which receives a signal read out from a desired closed or finite time region in the memory, calculates a discrete Fourier transform of the readout signal so that bandpass filter processing of the signal is performed in correspondence with a plurality of required frequencies while shifting a window function by a predetermined number of sample point units, and parallelly outputs processing results corresponding to the plurality of frequencies, an absolute value calculation means for calculating the absolute values of the processing results for each of a plurality of outputs from the DFT filter bank, and a peak value detection means for detecting a peak value of the absolute values in units of outputs from the absolute value calculation means. Note that the memory may randomly store the input signal, but signals must be time-serially read out therefrom.

As one of conventional non-sweep type frequency spectrum analyzing apparatuses, an FFT analyzer based on a fast Fourier transform (FFT) which adopts digital signal processing is known, as disclosed in, e.g., ANRITSU TECHNICAL BULLETIN No. 51, March 1986, pp. 52–57.

FIG. 10 shows the basis arrangement of such FFT analyzer. An input signal S(t) is converted into an intermediate frequency signal (IF signal) (i.e., its frequency band is limited) by a time sequence signal generation circuit 11 constituted by a mixer 11a, a local oscillator 11b, a bandpass filter 11c, and an A/D converter 11d. Thereafter, the converted signal is sampled and quantized to obtain a time sequence signal S(n). The time sequence signal S(n) is stored in a memory 12 in the order of the elapse of time. An FFT arithmetic operation unit 13 receives a signal read out from a desired region in the time domain in the memory 12 and performs FFT (DFT) processing of the readout signal. A display 14 displays the processed signal while plotting the frequency along the abscissa, and the DFT processing result (spectrum) along the ordinate.

However, such FFT analyzer is different from the frequency spectrum analyzing apparatus that utilizes the DFT filter bank according to the present invention in terms of the principle of spectral analysis and its analysis result, as will be described below.

The basic principle of the DFT filter bank itself utilized in the present invention is based on that disclosed in, e.g., CHROCHIERE and RABINER, "Multirate Digital Signal Processing", 1983 by Prentice-Hall, Inc., pp. 303–325. The difference between the processing of the DFT filter bank and the processing of the FFT analyzer will be explained below.

A case will be examined below wherein the spectral analysis of an input signal S(t) shown in FIG. 11 is performed within a desired analysis period (closed or finite time period) between $t_1$ and $t_2$.

An input signal S(t) is quantized by a circuit such as the time sequence signal generation circuit 11 shown in FIG. 10 to obtain a time sequence signal S(n). Note that n=−∞, ..., −2, −1, 0, 1, 2, ..., ∞. Based on the time sequence signal S(n), the following analysis is performed.

Let M(k) be the FFT (DFT) processing result for a desired closed time period (0, N−1) in the FFT analyzer. M(k) is given by equation (1) below:

$$M(k) = \sum_{n=0}^{N-1} S(n)g(n)\exp\left(j\frac{2\pi}{N} nk\right) \quad (1)$$

(for $k = 0, 1, 2, 3, \ldots, N-1$)

where g(n) is the window function sequence (to be also simply referred to as a window function), and is expressed by equation (2) below:

$$g(n) = \begin{cases} g(n) & 0 \leq n \leq N-1 \\ 0 & n \text{ other than above} \end{cases} \quad (2)$$

Let M(k, m) be the result of DFT filter bank processing of the time sequence signal S(n) for the same closed time period (0, N−1). M(k, m) is given by equation (3) below. Note that m is the time sequence index.

$$M(k, m) = \sum_{n=0}^{N-1} S(n)g(m-n)\exp\left(j\frac{2\pi}{N} nk\right) \quad (3)$$

(for $k = 0, 1, 2, 3, \ldots, N-1$)

As can be seen from equations (1) and (3) above, if the time sequence signal S(n) is the same as the window function sequence g(n), the difference between these two equations is the presence/absence of the time sequence index m. These two equations are interpreted as follows.

Equation (1) represents the discrete Fourier transform of the time sequence signal S(n) in the desired closed time period (0, N−1), i.e., the average value of the spectral values of the input signal S(t) in the closed time period between $t_1$ and $t_2$.

On the other hand, equation (3) may be considered as the discrete Fourier transform of the window function sequence g(n) at a point shifted therefrom to the right by the time sequence index m. However, in consideration of the DFT filter bank, as shown in FIG. 12, equation (3) may be construed to be the convolution integral of a time sequence signal S(n)exp(j2cnk/N) obtained by complex-modulating (frequency-shifting) the time sequence signal S(n) by a frequency Fsyk/N by a multiplier 20, and a finite impulse response (FIR) filter 21 having the window function sequence g(n). Note that Fs is the sampling frequency of the time sequence signal S(n).

In this case, the absolute value $|M(k, m)|^2$ of the output of equation (3) is equivalent to the value obtained when the time sequence signal S(n) is input to a digital BPF 22 which uses the window function sequence g(n) as a prototype filter sequence, and has a central frequency at the frequency Fs.k/N, and an absolute value calculation means 23 calculates the absolute value (i.e., detection sequence) $|M(k, m)|^2$ of the output from the BPF. That is, the DFT filter bank itself has a function of N digital BPFs shown in FIG. 12.

In order to obtain a spectrum equivalent to that obtained by the above-mentioned analog non-sweep type frequency spectrum analyzing apparatus (FIG. 9) With this DFT filter bank processing, the FIR filter 21 shown in FIG. 12 is designed to have the same bandwidth as that of the BPFs (frequency analyzing filters) of the BPF group 7 shown in FIG. 9, and Fs/N defined by the number N of discrete sample points (to be referred to as the number N of points hereinafter) to be processed by the DFT filter bank considered as an integrated unit of a plurality of filters, and the sampling frequency Fs of the time sequence signal S(n) assumes a value equal to or in the neighborhood of X/L (analyzing resolution) defined by the number L of desired frequency sample points within the desired span X described above. Note that the number of taps of the FIR filter 21 need not always equal the number N of points of the DFT filter bank.

The frequency spectrum analyzing apparatus according to the present invention with the arrangement based on the above-mentioned DFT filter bank can solve the above-mentioned problems, and has the following features.

More specifically, in the present invention, all the components (DFT filter bank, absolute value calculation means, and peak value detection means) other than the memory are processing means, and these processing means can be realized by a software program combined with a general arithmetic operation device (e.g., hardware such as a DSP (Digital Signal Processor)). Therefore, by modifying this software, both the frequency spectrum analyzing function (realized by special-purpose hardware in the conventional apparatus) and the signal processing function such as another analysis function, arithmetic operation function, and the like can be realized, thus improving hardware compatibility.

An embodiment of the present invention based on the above-mentioned outline will be described below with reference to the accompanying drawings.

FIG. 1 is a schematic block diagram showing the arrangement of the embodiment of the present invention, and FIGS. 2A to 2C are graphs for explaining the operation of the embodiment. Note that the same reference numerals in these figures denote the same parts as in the prior art.

Referring to FIG. 1, an input signal (a signal to be measured) S(t) is input to a time sequence signal generation circuit 11 constituted by a mixer 11a, a local oscillator 11b, a bandpass filter 11c, and an A/D converter 11d. The mixer 11a mixes a local signal having a predetermined frequency from the local oscillator 11b with the input signal S(t) to output an intermediate frequency signal (IF signal). The bandpass filter 11c limits the frequency band of the IF signal. The A/D converter 11d samples the band-limited IF signal in response to predetermined sampling signals from a control device 19 (to be described later), and outputs a time sequence signal S(n). The time sequence signal S(n) is stored in a memory 12 in the order of the elapse of time. In this case, for example, the time sequence signal S(n) shown in FIG. 2A is stored in the memory 12.

A signal of the time sequence signal S(n) stored in the memory 12 in a desired closed time period as a desired region of the time sequence in terms of time is read out from the memory 12 by the control device 19 which comprises, e.g., a microprocessor and controls the entire frequency spectrum analyzing apparatus shown in FIG. 1. The readout signal is input to a DFT filter bank 15 and its discrete Fourier transform is calculated. For example, as shown in FIG. 2A, a time sequence signal corresponding to the desired closed time period (time $N_1$–$N_2$) is read out from the memory 12, and is processed.

Upon reception of the time sequence signal S(n) in the closed time period M (time $N_1$–$N_2$), the DFT filter bank 15 performs filter processing corresponding to the above-mentioned FIR filter 21 shown in FIG. 12 for the input signal. More specifically, as shown in FIG. 2A, a DFT arithmetic processing unit 15a performs DFT filter bank processing while shifting the window function sequence g(n) by a predetermined sample point interval m from time $N_1$ to time $N_2$ (at this time, the window function sequence is g(M−n)). Note that this processing corresponds to the function of the BPF group 7 shown in FIG. 9, as described above.

A plurality of (k=0 to L−1) processing results (M(k, m)) output from the DFT filter bank 15 are input to an absolute value calculation unit 16 to calculate their absolute values ($|M(k, m)|^2$) in units of outputs. For example, as shown in FIG. 2B, the absolute value is calculated as a level as a function of time n and frequency k. Note that the calculation results are equal to the detection sequence of the absolute values $|M(k, m)|^2$ output from the above-mentioned absolute value calculation means 23 shown in FIG. 13.

The processing of the absolute value calculation unit 16 is executed by a multiplier 24 and an adder 25, as shown in FIG. 14. This means calculates an absolute value defined by equation (5) below when the output M(k, m) from the DFT filter bank 15 is expressed by equation (4) below, and corresponds to the function of the above-mentioned detector group 8 shown in FIG. 9.

$$M(k, m) = M_R(k, m) + jM_I(k, m) \quad (4)$$

$$|M(k, m)|^2 = M_R^2(k, m) + M_I^2(k, m) \quad (5)$$

The plurality of (k=0 to L−1) processing results ($|M(k, m)|^2$) output from the absolute value calculation unit 16 are input to a peak value detection unit 17 to detect their peak values in units of outputs. More specifically, as shown in FIG. 2B, peak values in the time direction are detected in units of frequencies k.

Note that the peak value detection unit 17 operates in accordance with an algorithm shown in the flow chart of FIG. 15, and corresponds to the function of the above-mentioned peak detector group 9 shown in FIG. 9. The algorithm shown in FIG. 15 is as follows.

In step (30), a peak value Peak(k) is initialized from the frequency sample point k=0 to L−1 (by substituting 0.0).

In step (31), the absolute value $|M(k, m)|^2$ output from the absolute value calculation unit 16 is substituted in a reference sequence a(k).

In step (32), the reference sequence a(k) is compared with the peak value Peak(k).

If a(k)>Peak(k), the flow advances to step (33).

On the other hand, if a(k)≧Peak(k), the flow advances to step (34).

In step (33), the peak value Peak(k) is substituted in the reference sequence a(k).

In step (34), it is checked if the frequency sample point k has reached L−1.

If k<L−1, k is incremented by 1, and the flow returns to step (32).

On the other hand, if k≧L−1, the flow advances to step (35).

In step (35), it is checked if the above-mentioned processing is completed for all "m"s.

If YES in step (35), the peak value detection processing ends, and Peak(k) becomes the spectrum of the time sequence signal S(n).

On the other hand, if NO in step (35), the flow returns to step (31).

Then, a plurality of (k=0 to L−1) peak values (Peak(k)) output from the peak value detection unit 17 are input to and processed by a display device 18 (including a display memory 18a and an arithmetic operation device 18b), and are displayed while the frequency is plotted along the abscissa and the level (amplitude) is plotted along the ordinate, as shown in FIG. 2C. That is, the frequency spectrum of the input signal is displayed.

In this embodiment, the predetermined number m of sample point units shown in FIGS. 2A and 2B is the time interval of the detection sequence, and when m=Dn, 1/D of the sampling frequency Fs upon sampling of the time sequence signal S(n) by the A/D converter 11d is defined as the sampling frequency of the detection sequence. More specifically, D determines the decimation rate of the detection sequence, and consequently determines the accuracy of the peak value detection result. In particular, when D=1, the maximum accuracy is obtained.

The DFT filter bank 15 can use an FFT if N is set to be a power of 2. For this reason, the processing speed can become higher than in the above-mentioned case wherein the digital BPFs independently operate, as shown in FIG. 12 or 13.

A case will be explained below wherein the adjacent and alternate channels power and occupancy bandwidth in PDC as one of the above-mentioned digital mobile communication systems are to be measured using the frequency spectrum analyzing apparatus (FIG. 1).

As for the measurement conditions, as in the measurement of the adjacent and alternate channels power using the above-mentioned sweep type spectrum analyzer (FIG. 5), a burst signal (FIG. 7) having the spectral characteristics shown in FIG. 8 is input as a signal to be measured (input signal), and the spectrum of this input signal is analyzed from a desired lowest analyzing frequency $f_L$ to a desired highest analyzing frequency $f_U$ at a frequency difference X/L (X: span, L: the number of frequency sample points) between adjacent frequency samples.

(a) The adjacent and alternate channels power limited to only one arbitrary slot in an arbitrary frame (e.g., the first slot of the first frame in FIG. 7) in the burst signal is measured as follows.

Referring to FIG. 1, the frequency of a local signal $f_L 0$ (=(carrier frequency $f_0$)−(IF signal frequency fIF)), output from the local oscillator 11b is set so that the lowest analyzing frequency $f_L$ (=$f_0$−X/2) defined by the span X and the carrier frequency $f_0$ is equal to or higher than DC (0 Hz) in the IF signal, and the highest analyzing frequency $f_U$ (=$f_0$+X/2) is equal to or lower than ½ the sampling frequency Fs (to satisfy the sampling theorem). In the DFT filter bank 15, the window function sequence g(n) is set to have a bandwidth equivalent to that of the analyzing filter 1d shown in FIG. 5 above, and the number N of points is set so that the number of points in the span X is equal to or larger than a desired number of points, and Fs/N and X/L are asymptotical.

Figure 7:
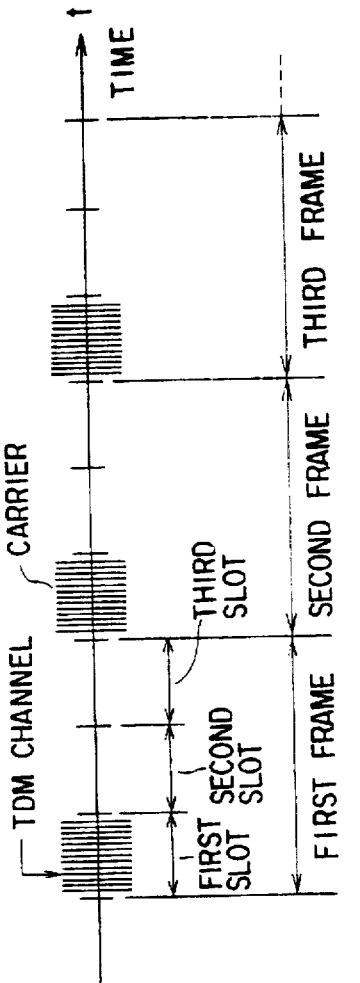
FIG. 7 is a chart showing the principle of a burst signal.
Figure 6:
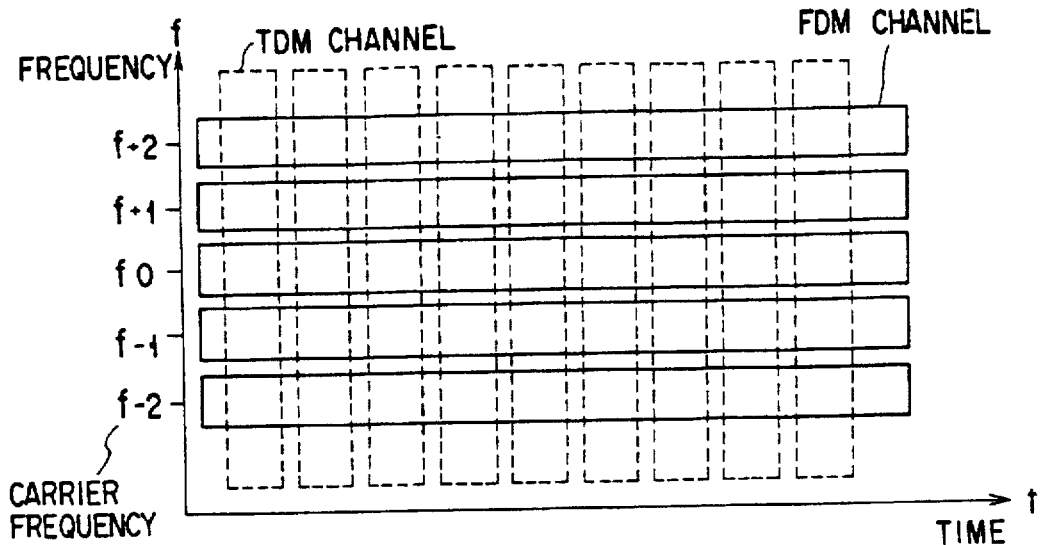
FIG. 6 is a chart showing the relationship between TDM and FDM channels.

When the burst signal shown in FIG. 7 is input as a signal S(t) to be measured to the apparatus with the above-mentioned settings, the signal S(t) to be measured is converted into a time sequence signal S(n) by the time sequence signal generation circuit 11, and the converted signal is stored in the memory 12 in the order of the elapse of time. In this case, in order to store the one arbitrary slot in the memory 12, the control device 19 may store the time sequence signal S(n) for at least one frame time in the memory 12, or a means (not shown) for detecting the leading edge of the burst signal may be arranged, the input signal may be A/D-converted based on the detection signal from this means, and the converted signal may be sequentially stored in the memory 12.

The time sequence signal S(n) stored in the memory 12 is read out by the control device 19, as described above, and is then subjected to detection of peak values in units of analyzing frequencies, i.e., spectral analysis, in the DFT filter bank 15, the absolute value detection unit 16, and the peak value detection unit 17.

The peak values (spectrum) are input to the display device 18, and are temporarily stored in the display memory 18a. The stored values are read out by the arithmetic operation device 18b comprising, e.g., a microprocessor, and powers are calculated in units of FDM channels, thus obtaining the adjacent channel leakage power. More specifically, based on equations (6), (7), (8), (9), and (10) below, a power $Pf_0$ of the traffic channel (FDM channel $f_0$), powers $Pf_{-1}$ and $Pf_{+1}$ of the adjacent channels (FDM channels $f_{-1}$ and $f_{+1}$), and powers $Pf_{-2}$ and $Pf_{+2}$ of the first alternate channels (FDM channels $f_{-2}$ and $f_{+2}$) shown in FIG. 8 are calculated:

$$Pf_0 = \int_{f_0-\frac{\Delta f}{2}}^{f_0+\frac{\Delta f}{2}} \text{Peak}(f)\,df\,[\text{dB}_m] \quad (6)$$

$$Pf_{-1} = \int_{f_{-1}-\frac{\Delta f}{2}}^{f_{-1}+\frac{\Delta f}{2}} \text{Peak}(f)\,df\,[\text{dB}_m] \quad (7)$$

$$Pf_{+1} = \int_{f_{-1}-\frac{\Delta f}{2}}^{f_{+1}+\frac{\Delta f}{2}} \text{Peak}(f)\,df\,[\text{dB}_m] \quad (8)$$

$$Pf_{-2} = \int_{f_{-2}-\frac{\Delta f}{2}}^{f_{-2}+\frac{\Delta f}{2}} \text{Peak}(f)\,df\,[\text{dB}_m] \quad (9)$$

$$Pf_{+2} = \int_{f_{+2}-\frac{\Delta f}{2}}^{f_{+2}+\frac{\Delta f}{2}} \text{Peak}(f)\,df\,[\text{dB}_m] \quad (10)$$

Subsequently, based on equations (11), (12), (13), and (14) below, leakage powers $ACP(f_{-1})$ and $ACP(f_{+1})$ from the traffic channel to the adjacent channels, and leakage powers $ACP(f_{-2})$ and $ACP(f_{+2})$ from the traffic channel to the first alternate channels are respectively calculated:

$$ACP(f_{-1}) = Pf_{-1} - Pf_0 \quad (11)$$

$$ACP(f_{+1}) = Pf_{+1} - Pf_0 \quad (12)$$

$$ACP(f_{-2}) = Pf_{-2} - Pf_0 \quad (13)$$

$$ACP(f_{+2}) = Pf_{+2} - Pf_0 \quad (14)$$

Since the carrier frequency $f_0$ (that of the FDM channel $f_0$) corresponds to the frequency $f_{IF}$ of the IF signal in the time sequence on the memory 12 shown in FIG. 1, the peak value (Peak(k)) of the spectrum output from the peak detection unit 17 becomes equivalent to Peak(f) given by equations (7) and (8) via equation (15) below:

$$\text{Peak}\left(f - f_0 + f_{IF} + \frac{F_s}{N}k\right) = \text{Peak}(k) \quad (15)$$

Therefore, the arithmetic operation device 18b calculates the adjacent and alternate channels power based on equation (15) above.

(b) The occupancy bandwidth limited to only one arbitrary slot in an arbitrary frame (e.g., the first slot of the first frame in FIG. 7) in the burst signal is measured as follows.

Note that the occupancy bandwidth is a quantity used for evaluating the degree of influence of the use of the traffic channel on the adjacent and first alternate channels, and most of the factors that influence this quantity relate to the performance of a transmitter of the base or mobile station as in the case of the adjacent and alternate channels power.

In FIG. 1, the frequency $f_L0$ of the local signal output from the local oscillator 11b is set, the window function sequence g(n) and the number N of points of the DFT filter bank 15 are set, the burst signal (FIG. 7) input as a signal S(t) to be measured is analyzed, and the peak values (spectrum) in units of analyzing frequencies are input to and stored in the display device 18 in the same manner as the case of the adjacent channel leakage power described in item (a) above.

The occupancy bandwidth is obtained by calculating the spectrum by the arithmetic operation device 18b comprising, e.g., a microprocessor.

More specifically, based on equation (16) below, a sum total power P0 in the span X is calculated:

$$P_0 = \int_{f_0-\frac{X}{2}}^{f_0+\frac{X}{2}} \text{Peak}(f)\,df\,[\text{dBm}] \quad (16)$$

Subsequently, as shown in FIG. 16, frequency samples are integrated from the lowest analyzing frequency $f_L$ toward the frequency $f_0$, and the frequency, $f_{LL}$, of a lower-limit sample asymptotic to a power corresponding to 0.5% of $P_0$ is calculated based on equation (17) below. Furthermore, frequency samples are integrated from the highest analyzing frequency $f_U$ toward the frequency $f_0$, and the frequency, $f_{UU}$, of an upper-limit sample asymptotic to a power corresponding to 0.5% of $P_0$ is calculated based on equation (18) below. Then, the occupancy bandwidth, OCCBW, is calculated using equation (19) below:

$$P_0 \cdot 0.05 = \int_{f_{LL}}^{f_0-\frac{X}{2}} \text{Peak}(f)\,df\,[\text{dBm}] \quad (17)$$

$$P_0 \cdot 0.05 = \int_{f_0-\frac{X}{2}}^{f_{UU}} \text{Peak}(f)\,df\,[\text{dBm}] \quad (18)$$

$$OCCBW = f_{UU} - f_{LL} \quad (19)$$

Note that the arithmetic operation device 18b calculates the occupancy bandwidth based on equation (15) as in the case of the adjacent and alternate channels power described in item (a) above.

In the above-mentioned embodiment shown in FIG. 1, the time sequence signal generation circuit 11 comprises the mixer 11a and the local oscillator 11b, and converts an input signal into an IF signal to obtain a time sequence signal. Alternatively, if the input signal is one falling within the frequency band that can be directly sampled by the A/D converter 11d, the mixer 11a and the local oscillator 11b can be omitted, needless to say.

In this case, the bandpass filter 11c may be inserted before or after the A/D converter 11d, as needed.

On the other hand, when the input signal is orthogonal-transformed by an in-phase component (I) and an orthogonal component (Q), the time sequence signal generation circuit 11 may comprise two sets of the above components in FIG. 1, as shown in, e.g., FIG. 3. More specifically, an input signal S(t) is divided into two routes, so that in-phase data (In) is generated by one route, and orthogonal data (Qn) is generated by the other route, and these data are output as a time sequence signal S(n) to the memory 12.

Note that the same reference numerals in FIG. 3 denote the same parts as in FIG. 1, and a detailed description thereof will be omitted. In FIG. 3, a 90° phase shifter 11e is added.

Furthermore, the time sequence signal generation circuit 11 shown in, e.g., FIG. 4 as a digital circuit of that shown in FIG. 3 may be used. More specifically, the A/D converter 11d samples an input signal S(t) at a sampling timing Ts and outputs a time sequence signal in advance. The time sequence signal is divided into two routes. In one route, the signal is multiplied with a real component (Re) from an orthogonal carrier sequence generation circuit 11 for generating $e^{j(2\pi f_0/F_s \cdot nT_s)}$ by a multiplier 11f, and components other than the baseband component are removed from the product signal by a bandpass digital filter 11g, thus generating in-phase data (In). In the other route, the signal is multiplied with an imaginary component (Im) from the orthogonal carrier sequence generation circuit 11h, and components other than the baseband component are removed from the product signal, thus generating orthogonal data (Qn). Each data is output as a time sequence signal S(n) to the memory 12.

Note that the time sequence signal generation circuit 11 is not limited to those described above as long as it can generate and output a time sequence signal obtained by sampling a received input signal.

As described above, the frequency spectrum analyzing apparatus of the present invention comprises the memory for storing a time sequence signal obtained by sampling a signal to be measured, the DFT filter bank for receiving signals read out from the memory in a desired closed time period of the time sequence signal, and calculating a discrete Fourier transform of the signal so that bandpass filter processing of the signal is performed in correspondence with a plurality of desired frequencies, the absolute value calculation means for calculating the absolute values of processing results for each of a plurality of outputs from the DFT filter bank, and the peak value detection means for detecting the peak values of the absolute values in units of outputs from the absolute value calculation means, and outputting the peak values in correspondence with the plurality of frequencies. Therefore, the apparatus of the present invention has the following effects.

(1) The present invention solves a problem of the sweep type frequency spectrum analyzing apparatus (spectrum analyzer), which cannot perform spectral analysis of a desired closed time period of a signal to be measured.

More specifically, when the adjacent and alternate channels power, occupancy bandwidth, or the like is measured on the basis of a burst signal used in a TDMA communication (PDC, PHS, or the like), a measurement limited to only one arbitrary slot in an arbitrary frame in the burst signal can be performed. As for the measurement time, as compared to the sweep type spectrum analyzing apparatus which requires a time equal to or longer than (number L of frequency sample points)×(one-frame time interval of burst signal), the present invention can greatly increase the processing speed since it can perform a measurement for one frame of the burst signal.

(2) All the components (DFT filter bank, absolute value calculation means, and peak value detection means) other than the memory are processing means, and these processing means can be realized by a software program combined with a general arithmetic operation device (e.g., hardware such as a DSP). Therefore, by modifying this software, both the frequency spectrum analyzing function (realized by special-purpose hardware in the conventional apparatus) and the signal processing function such as another analysis function, arithmetic operation function, and the like can be realized, thus improving hardware compatibility and realizing size and weight reductions of the apparatus.

(3) The results equivalent to those measured by the measurement method of the MKK recommendation mentioned previously can be obtained, and high-speed measurements can be performed.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A frequency spectrum analyzing apparatus comprising:
a time sequence signal generator for generating a time sequence signal by sampling a signal to be measured;
a storage device for storing the time sequence signal generated by said time sequence signal generator;
a discrete Fourier transform (DFT) filter bank for receiving a signal read out from said storage device in a desired closed time period of the time sequence signal stored in said storage device, for calculating a discrete Fourier transform of the read out signal so that bandpass filter processing of the signal is performed in correspondence with a plurality of desired frequencies, and for outputting processing results in parallel for the plurality of desired frequencies;
an absolute value calculator for calculating absolute values of the processing results for each of a plurality of outputs from said DFT filter bank; and
a peak value detector for detecting peak values of the absolute values in units of outputs from said absolute value calculator, and for outputting the peak values in correspondence with the plurality of desired frequencies;
wherein said time sequence signal generator comprises:
a local oscillator for oscillating a local signal having a predetermined frequency;
a phase shifter for shifting a phase of the local signal oscillated by said local oscillator through 90°;
a first mixer for mixing the signal to be measured with the 90° phase-shifted local signal shifted by said phase shifter, and for outputting a first intermediate frequency (IF) signal;
a first bandpass filter for limiting a frequency band of the first IF signal output by said first mixer;
a first analog/digital converter for sampling the first IF signal band-limited by said first bandpass filter, and for outputting a first time sequence signal;
a second mixer for mixing the signal to be measured with the local signal oscillated by said local oscillator, and for outputting a second IF signal which has an orthogonal relationship with respect to the first IF signal;
a second bandpass filter for limiting a frequency band of the second IF signal output by said second mixer; and
a second analog/digital converter for sampling the second IF signal band-limited by said second bandpass filter, and for outputting a second time sequence signal which has an orthogonal relationship with respect to the first time sequence signal.

2. A frequency spectrum analyzing apparatus comprising:
a time sequence signal generator for generating a time sequence signal by sampling a signal to be measured;
a storage device for storing the time sequence signal generated by said time sequence signal generator;
a discrete Fourier transform (DFT) filter bank for receiving a signal read out from said storage device in a desired closed time period of the time sequence signal stored in said storage device, for calculating a discrete Fourier transform of the read out signal so that bandpass filter processing of the signal is performed in correspondence with a plurality of desired frequencies, and for outputting processing results in parallel for the plurality of desired frequencies;
an absolute value calculator for calculating absolute values of the processing results for each of a plurality of outputs from said DFT filter bank; and
a peak value detector for detecting peak values of the absolute values in units of outputs from said absolute value calculator, and for outputting the peak values in correspondence with the plurality of desired frequencies;

wherein said time sequence signal generator comprises:
an analog/digital (A/D) converter for sampling the signal to be measured at a predetermined sampling timing, and for outputting a time sequence signal;
an orthogonal carrier sequence generation circuit for generating an orthogonal carrier sequence signal including real and imaginary components;
a first multiplier for multiplying the time sequence signal output by said A/D converter with the real component of the orthogonal carrier sequence generated by said orthogonal carrier sequence generation circuit, and for outputting in-phase data;
a first bandpass filter for performing a first band limitation for removing components other than a baseband component from the in-phase data output by said first multiplier, and for outputting the first band-limited data;
a second multiplier for multiplying the time sequence signal output by said A/D converter with the imaginary component of the orthogonal carrier sequence generated by said orthogonal carrier sequence generation circuit, and for outputting orthogonal data; and
a second bandpass filter for performing a second band limitation for removing components other than a baseband component from the orthogonal data output by said second multiplier, and for outputting the second band-limited data.

3. A frequency spectrum analyzing apparatus comprising:
a time sequence signal generator for generating a time sequence signal by sampling a signal to be measured;
a storage device for storing the time sequence signal generated by said time sequence signal generator;
a controller for reading out a signal of the time sequence signal stored in said storage device corresponding to a desired closed time period;
a discrete Fourier transform (DFT) filter bank for calculating a discrete Fourier transform of the signal of the desired period read out from said storage device by said controller so that bandpass filter processing of the read out signal is performed in correspondence with a plurality of desired frequencies while shifting a window function by a predetermined sample point interval, and for outputting processing results in parallel for the plurality of desired frequencies;
an absolute value calculator for calculating absolute values of the processing results for each of a plurality of outputs from said DFT filter bank;
a peak value detector for detecting peak values of the absolute values in units of outputs from said absolute value calculator, and for outputting the peak values in correspondence with the plurality of desired frequencies; and
a display for displaying the peak values output from said peak value detector in correspondence with the plurality of desired frequencies;
wherein said time sequence signal generator comprises:
a local oscillator for oscillating a local signal having a predetermined frequency;
a phase shifter for shifting a phase of the local signal oscillated by said local oscillator through 90°;
a first mixer for mixing the signal to be measured with the 90° phase-shifted local signal shifted by said phase shifter, and for outputting a first intermediate frequency (IF) signal;
a first bandpass filter for limiting a frequency band of the first IF signal output by said first mixer;

a first analog/digital converter for sampling the first IF signal band-limited by said first bandpass filter, and for outputting a first time sequence signal;
a second mixer for mixing the signal to be measured with the local signal oscillated by said local oscillator, and for outputting a second IF signal which has an orthogonal relationship with respect to the first IF signal;
a second bandpass filter for limiting a frequency band of the second IF signal output by said second mixer; and
a second analog/digital converter for sampling the second IF signal band-limited by said second bandpass filter, and for outputting a second time sequence signal which has an orthogonal relationship with respect to the first time sequence signal.

4. A frequency spectrum analyzing apparatus comprising:
a time sequence signal generator for generating a time sequence signal by sampling a signal to be measured;
a storage device for storing the time sequence signal generated by said time sequence signal generator;
a controller for reading out a signal of the time sequence signal stored in said storage device corresponding to a desired closed time period;
a discrete Fourier transform (DFT) filter bank for calculating a discrete Fourier transform of the signal of the desired period read out from said storage device by said controller so that bandpass filter processing of the read out signal is performed in correspondence with a plurality of desired frequencies while shifting a window function by a predetermined sample point interval, and for outputting processing results in parallel for the plurality of desired frequencies;
an absolute value calculator for calculating absolute values of the processing results for each of a plurality of outputs from said DFT filter bank;
a peak value detector for detecting peak values of the absolute values in units of outputs from said absolute value calculator, and for outputting the peak values in correspondence with the plurality of desired frequencies; and
a display for displaying the peak values output from said peak value detector in correspondence with the plurality of desired frequencies;
wherein said time sequence signal generator comprises:
an analog/digital (A/D) converter for sampling the signal to be measured at a predetermined sampling timing, and for outputting a time sequence signal;
an orthogonal carrier sequence generation circuit for generating an orthogonal carrier sequence signal including real and imaginary components;
a first multiplier for multiplying the time sequence signal output by said A/D converter with the real component of the orthogonal carrier sequence generated by said orthogonal carrier sequence generation circuit, and for outputting in-phase data;
a first bandpass filter for performing a first band limitation for removing components other than a baseband component from the in-phase data output by said first multiplier, and for outputting the first band-limited data;
a second multiplier for multiplying the time sequence signal output by said A/D converter with the imaginary component of the orthogonal carrier sequence generated by said orthogonal carrier sequence generation circuit, and for outputting orthogonal data; and a second bandpass filter for performing a second band limitation for removing components other than a baseband component from the orthogonal data output by said second multiplier, and for outputting the second band-limited data.

5. An adjacent and alternate channels power measurement apparatus for measuring power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, said apparatus comprising:

a time sequence signal generator for generating a time sequence signal by sampling the burst signal;

a storage device for storing the time sequence signal generated by said time sequence signal generator;

a discrete Fourier transform (DFT) filter bank for receiving a signal read out from said storage device in a desired closed time period of the time sequence signal stored in said storage device, for calculating a discrete Fourier transform of the received signal so that bandpass filter processing of the read out signal is performed in correspondence with a plurality of desired frequencies while shifting a window function by a predetermined number of sample point units, and for outputting processing results in parallel for the plurality of desired frequencies;

an absolute value calculator for calculating absolute values of the processing results for each of a plurality of outputs from said DFT filter bank;

a peak value detector for detecting peak values of the absolute values in units of outputs from said absolute value calculator, and for outputting the peak values in correspondence with the plurality of desired frequencies; and an arithmetic operator for calculating the power present in the predetermined frequency range to have, as the central frequency, the frequency of at least one of the adjacent and alternate channels in accordance with the outputs from said peak value detector;

wherein said time sequence signal generator comprises:

a local oscillator for oscillating a local signal having a predetermined frequency;

a phase shifter for shifting a phase of the local signal oscillated by said local oscillator through 90°;

a first mixer for mixing the burst signal with the 90° phase-shifted local signal shifted by said phase shifter, and for outputting a first intermediate frequency (IF) signal;

a first bandpass filter for limiting a frequency band of the first IF signal output by said first mixer;

a first analog/digital converter for sampling the first IF signal band-limited by said first bandpass filter, and for outputting a first time sequence signal;

a second mixer for mixing the burst signal with the local signal oscillated by said local oscillator, and for outputting a second IF signal which has an orthogonal relationship with respect to the first IF signal;

a second bandpass filter for limiting a frequency band of the second IF signal output by said second mixer; and a second analog/digital converter for sampling the second IF signal band-limited by said second bandpass filter, and for outputting a second time sequence signal which has an orthogonal relationship with respect to the first time sequence signal.

6. An adjacent and alternate channels power measurement apparatus for measuring power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, said apparatus comprising:

a time sequence signal generator for generating a time sequence signal by sampling the burst signal;

a storage device for storing the time sequence signal generated by said time sequence signal generator;

a discrete Fourier transform (DFT) filter bank for receiving a signal read out from said storage device in a desired closed time period of the time sequence signal stored in said storage device, for calculating a discrete Fourier transform of the received signal so that bandpass filter processing of the read out signal is performed in correspondence with a plurality of desired frequencies while shifting a window function by a predetermined number of sample point units, and for outputting processing results in parallel for the plurality of desired frequencies;

an absolute value calculator for calculating absolute values of the processing results for each of a plurality of outputs from said DFT filter bank;

a peak value detector for detecting peak values of the absolute values in units of outputs from said absolute value calculator, and for outputting the peak values in correspondence with the plurality of desired frequencies; and an arithmetic operator for calculating the power present in the predetermined frequency range to have, as the central frequency, the frequency of at least one of the adjacent and alternate channels in accordance with the outputs from said peak value detector;

wherein said time sequence signal generator comprises:

an analog/digital (A/D) converter for sampling the burst signal at a predetermined sampling timing, and for outputting a time sequence signal;

an orthogonal carrier sequence generation circuit for generating an orthogonal carrier sequence signal including real and imaginary components;

a first multiplier for multiplying the time sequence signal output by said A/D converter with the real component of the orthogonal carrier sequence generated by said orthogonal carrier sequence generation circuit, and for outputting in-phase data;

a first bandpass filter for performing a first band limitation for removing components other than a baseband component from the in-phase data output by said first multiplier, and for outputting the first band-limited data;

a second multiplier for multiplying the time sequence signal output by said A/D converter with the imaginary component of the orthogonal carrier sequence generated by said orthogonal carrier sequence generation circuit, and for outputting orthogonal data; and a second bandpass filter for performing a second band limitation for removing components other than a baseband component from the orthogonal data output by said second multiplier, and for outputting the second band-limited data.

7. An occupancy bandwidth measurement apparatus for measuring an occupancy bandwidth based on power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, said apparatus comprising:

a time sequence signal generator for generating a time sequence signal by sampling the burst signal;

a storage device for storing the time sequence signal generated by said time sequence signal generator;

a discrete Fourier transform (DFT) filter bank for receiving a signal read out from said storage device in a desired closed time period of the time sequence signal stored in said storage device, for calculating a discrete Fourier transform of the received signal so that bandpass filter processing of the read out signal is performed in correspondence with a plurality of desired frequencies while shifting a window function by a predetermined number of sample point units, and for outputting processing results in parallel for the plurality of desired frequencies;

an absolute value calculator for calculating absolute values of the processing results for each of a plurality of outputs from said DFT filter bank;

a peak value detector for detecting peak values of the absolute values in units of outputs from said absolute value calculator, and for outputting the peak values in correspondence with the plurality of desired frequencies; and an arithmetic operator for calculating the power present in the predetermined frequency range to have, as the central frequency, the frequency of at least one of the adjacent and alternate channels in accordance with the outputs from said peak value detector, and for calculating the occupancy bandwidth based on the calculated power;

wherein said time sequence signal generator comprises:

a local oscillator for oscillating a local signal having a predetermined frequency;

a phase shifter for shifting a phase of the local signal oscillated by said local oscillator through 90°;

a first mixer for mixing the burst signal with the 90° phase-shifted local signal shifted by said phase shifter, and for outputting a first intermediate frequency (IF) signal;

a first bandpass filter for limiting a frequency band of the first IF signal output by said first mixer;

a first analog/digital converter for sampling the first IF signal band-limited by said first bandpass filter, and for outputting a first time sequence signal;

a second mixer for mixing the burst signal with the local signal oscillated by said local oscillator, and for outputting a second IF signal which has an orthogonal relationship with respect to the first IF signal;

a second bandpass filter for limiting a frequency band of the second IF signal output by said second mixer; and a second analog/digital converter for sampling the second IF signal band-limited by said second bandpass filter, and for outputting a second time sequence signal which has an orthogonal relationship with respect to the first time sequence signal.

8. An occupancy bandwidth measurement apparatus for measuring an occupancy bandwidth based on power present in a predetermined frequency band to have, as a central frequency, a frequency of at least one of adjacent and alternate channels assigned at predetermined frequency intervals from a carrier frequency upon reception of a burst signal in which ON and OFF durations of a modulated carrier repetitively appear at predetermined time intervals, said apparatus comprising:

a time sequence signal generator for generating a time sequence signal by sampling the burst signal;

a storage device for storing the time sequence signal generated by said time sequence signal generator;

a discrete Fourier transform (DFT) filter bank for receiving a signal read out from said storage device in a desired closed time period of the time sequence signal stored in said storage device, for calculating a discrete Fourier transform of the received signal so that bandpass filter processing of the read out signal is performed in correspondence with a plurality of desired frequencies while shifting a window function by a predetermined number of sample point units, and for outputting processing results in parallel for the plurality of desired frequencies;

an absolute value calculator for calculating absolute values of the processing results for each of a plurality of outputs from said DFT filter bank;

a peak value detector for detecting peak values of the absolute values in units of outputs from said absolute value calculator, and for outputting the peak values in correspondence with the plurality of desired frequencies; and an arithmetic operator for calculating the power present in the predetermined frequency range to have, as the central frequency, the frequency of at least one of the adjacent and alternate channels in accordance with the outputs from said peak value detector, and for calculating the occupancy bandwidth based on the calculated power;

wherein said time sequence signal generator comprises:

an analog/digital (A/D) converter for sampling the burst signal at a predetermined sampling timing, and for outputting a time sequence signal;

an orthogonal carrier sequence generation circuit for generating an orthogonal carrier sequence signal including real and imaginary components;

a first multiplier for multiplying the time sequence signal output by said A/D converter with the real component of the orthogonal carrier sequence generated by said orthogonal carrier sequence generation circuit, and for outputting in-phase data;

a first bandpass filter for performing a first band limitation for removing components other than a baseband component from the in-phase data output by said first multiplier, and for outputting the first band-limited data;

a second multiplier for multiplying the time sequence signal output by said A/D converter with the imaginary component of the orthogonal carrier sequence generated by said orthogonal carrier sequence generation circuit, and for outputting orthogonal data; and a second bandpass filter for performing a second band limitation for removing components other than a baseband component from the orthogonal data output by said second multiplier, and for outputting the second band-limited data.

* * * * *